United States Patent [19]

Allen et al.

[11] 3,970,876
[45] July 20, 1976

[54] VOLTAGE AND TEMPERATURE COMPENSATION CIRCUITRY FOR CURRENT MODE LOGIC

[75] Inventors: William W. Allen, Ambler, Pa.; Herbert Stopper, Orchard Lake, Mich.

[73] Assignee: Burroughs Corporation, Detroit, Mich.

[22] Filed: Aug. 14, 1975

[21] Appl. No.: 604,705

Related U.S. Application Data

[63] Continuation of Ser. No. 366,083, June 1, 1973, abandoned.

[52] U.S. Cl.............................. 307/310; 307/297; 307/218
[51] Int. Cl.² ......................................... H03K 17/00
[58] Field of Search ........... 307/310, 296, 297, 218; 330/30 D; 357/28

[56] References Cited
UNITED STATES PATENTS

| | | | |
|---|---|---|---|
| 3,419,810 | 12/1968 | Xylander | 330/30 D |
| 3,573,495 | 4/1971 | Xylander | 307/310 |
| 3,579,272 | 5/1971 | Foss | 307/310 |
| 3,636,384 | 1/1972 | DeWitt | 307/310 |
| 3,668,429 | 6/1972 | Ainsworth | 307/310 |

*Primary Examiner*—Stanley D. Miller, Jr.
*Assistant Examiner*—B. P. Davis
*Attorney, Agent, or Firm*—Manuel Quiogue; Charles P. Padgett, Jr.; William B. Penn

[57] ABSTRACT

An improved CML (Current Mode Logic) gate having voltage and temperature compensating means for maintaining output levels and input thresholds invariant with fluctuations in supply voltage and junction temperature. The output of the compensating means, measured with respect to ground, will track variations in supply voltage on a one-to-one basis except that the output is allowed to vary by one $V_{be}$ with junction temperature. This output is supplied to the base of the constant-current source transistor which feeds the differential amplifier stage of the CML gate and to the base of a constant current source transistor whose collector is coupled to the base of the non-input transistor of the differential amplifier stage of the CML gate. The compensating circuitry includes an output transistor, resistive means for tracking variations in supply voltage, and a temperature compensation network having a temperature compensation factor of zero, both said resistive means and the output of said temperature compensation network are coupled to the base of the output transistor. The temperature compensation network achieves an overall compensation factor of zero by combining a temperature compensating subcircuit having a compensation factor of minus one with a temperature compensating subcircuit having a compensation factor of plus one via a unique voltage divider arrangement.

23 Claims, 5 Drawing Figures

VOLTAGE AND TEMPERATURE COMPENSATION CIRCUITRY FOR CURRENT MODE LOGIC

This is a continuation of application Ser. No. 366,083 now abandoned, filed June 1, 1973, by the present inventors.

BACKGROUND OF THE INVENTION

This invention relates to compensated CML logic circuits and more specifically to an improved integratable CML logic circuit which includes voltage and temperature compensation means.

A typical CML logic circuit arrangement may employ two transistors having their emitters connected to each other. The coupled emitters are then coupled through a constant current source transistor and an emitter resistor to a source of potential. The base of one of the two first-mentioned transistors and the base of the constant current source transistor and an emitter resistor to a source of potential. The base of one of the two first-mentioned transistors and the base of the constant current source transistor are normally coupled to one or more sources of reference potential, the base of the other of said two first-mentioned transistors serving as an input to the CML logic circuit.

The sources of reference potential may be derived from a voltage divider or taken directly from one or more voltage sources. The function of the constant current source transistor is to keep the overall emitter current of the two emitter-coupled transistors at a predetermined constant value. The value of the current is determined by the value of the emitter-resistor of the constant current source transistor, by the reference voltage applied to the base of the constant current source transistor, and by the emitter-base junction voltage of the constant current source transistor. Any variation in supply voltage or in the junction temperature will result in a variation of the voltage across the emitter-base junction of the constant current source transistor, since this voltage is strongly temperature dependent. If the voltage at the base of the constant current source transistor should be kept at a truly constant value with respect to ground by the reference potential, then variations in the voltage at the emitter of the constant current source transistor, as from fluctuations in junction temperature or from variations in power supply, would result in a varying current through the two commonly coupled transistors.

If the reference potential at the base of one of the two first-mentioned transistors is taken from the collector of a fourth transistor whose emitter is coupled through a resistor to a source of potential, and if the reference voltage at the base of the fourth transistor should be kept absolutely constant with respect to ground, the circuit will similarly fail to compensate for variations in supply voltage and junction temperature. Thus, variations in the input threshold levels and in variations in the levels of the output signals would result. Attempts have been made in the prior art to solve these temperature-related problems, as illustrated by U.S. Pat. Nos. 3,560,770 to J. Giles; 3,590,274 to R. Marley; and 3,622,799 to R. Marley et al.; but these prior attempts have not been totally successful. None of these attempts achieve the degree of total compensation possible with applicants' circuit. Only applicants' unique compensation compensates for fluctuations in junction temperature and for variations in power supply so as to insure that the output levels and input thresholds remain truly invarient.

SUMMARY OF THE INVENTION

It is an object of this invention to provide a compensated CML logic circuit whose input thresholds and output levels are invariant with changes in supply voltage and junction temperature.

It is a further object of this invention to provide a voltage and temperature compensated integratable CML logic circuit.

It is yet a further object of this invention to provide a compensation circuit which tracks variations in power supply voltage on a one-to-one basis, measured with respect to ground, except that the compensation circuit output is allowed to vary by one $V_{be}$ with variations in junction temperature.

It is still a further object of this invention to provide a fully-compensated constant current source whose output is invariant with variations in supply voltage or junction temperature.

These and other objects of this invention are herein illustrated in a CML logic circuit which includes the voltage and temperature compensating circuit of the present invention. The output of the compensating circuit is coupled to the base of the constant current source transistor which feeds the differential amplifier stage of the CML logic gate and to the base of a second constant current source transistor whose collector voltage is used to bias the non-input transistor of the differential amplifier stage of the current switch. The output of the compensation circuit, which is applied to the bases of these constant current source transistors, will track variations in power supply voltage on a one-to-one basis, measured with respect to ground, except that the voltage is allowed to vary by one $V_{be}$ with variations in junction temperature. The compensation circuitry includes a temperature compensating network having a temperature compensation factor of zero and a resistive means; both the temperature compensation network and the resistive means are coupled with the base of a compensation circuit output transistor. The resistive means provides for a one-to-one tracking of fluctuations in supply voltage, and the voltage drop across the base-to-emitter junction of the output transistor provides a temperature compensation factor for the overall compensation circuit of minus one. The temperature compensation network itself provides an overall compensation factor of zero by combining a temperature compensating subcircuit having a compensation factor of minus one with a temperature compensating subcircuit having a temperature compensation factor of plus one via a unique voltage divider arrangement whereby the tapped output of the voltage divider couples an overall compensation factor of zero to the base of the compensation circuit's output transistor; the base-to-emitter junction of the output transistor itself contributing the overall temperature compensation factor of minus one.

BRIEF DESCRIPTION OF THE DRAWINGS

The above-cited objects of the invention together with other objects and advantages which may be obtained by its use, will be apparent from the following detailed description of the invention taken in conjunction with the drawing.

DETAILED DESCRIPTION

Figure 1:
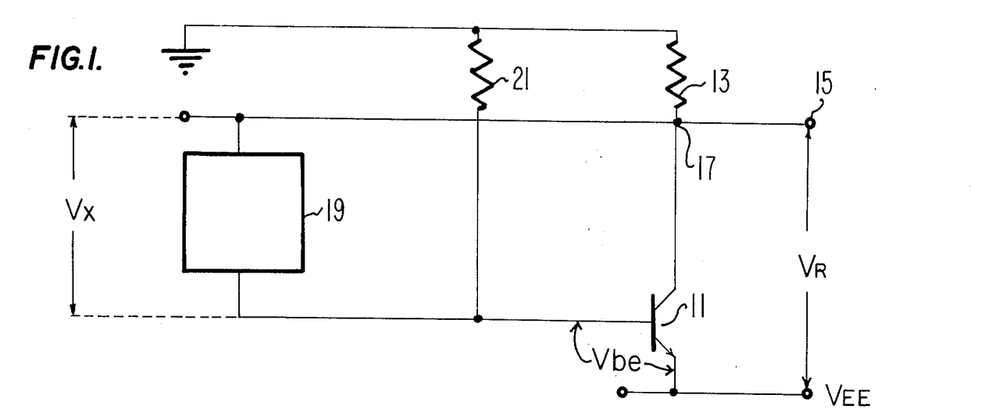
FIG. 1 is a schematic diagram of the overall compensation network of the present invention.

Referring first to FIG. 1, the broad concept of the overall compensation network of the present invention will be described. A compensation network output transistor 11, also referred to as compensation network output transistor Q1, has its emitter coupled to a source of potential $V_{EE}$ and its collector coupled to ground through resistor 13. The output 15 of the compensation network is taken from the junction 17 of the collector of transistor 11 and the non-grounded end of resistor 13. A temperature compensating network is illustrated by block 19, one terminal of which is connected to junction 17 and the other terminal of which is connected to the base of transistor 11. The voltage $V_x$ which appears across the temperature compensating circuit 19 involves a temperature compensating factor of its own which is applied between the base of transistor 11 and output 15 via junction 17 so as to contribute to the overall compensation factor inherent in the compensated voltage $V_R$ which is measured with respect to the power supply voltage $V_{EE}$ and which is defined as the voltage measured between the source of potential $V_{EE}$ and junction 17 or the compensation network output 15.

The base of output transistor 11 is also connected to ground through a resistor 21 so as to enable the output transistor 11 to conduct so as to have the voltage at the junction 17, measured with respect to ground, track fluctuations in supply voltage on a one-to-one basis. Hence, the voltage $V_R$, which is measured with respect to the supply voltage $V_{EE}$, will remain absolutely invariant with variations in supply voltage but will be allowed to vary by one $V_{be}$ with variations in junction temperature.

The overall compensated voltage $V_R$ is determined by the temperature compensating voltage $V_x$ of the circuit of block 19 and by the base-to-emitter drop across the compensation output transistor 11 and is given by the formula $V_R = V_x + V_{be}$. $V_R$ is, by definition, invariant with respect to supply voltage since resistor 21 provides for a one-to-one tracking of variations in supply voltage with respect to ground. The total regulated voltage is therefore given by $V_R = V_x + V_{be}$ which is invariant with respect to variations in supply voltage but which allows for voltage compensation for temperature-induced voltage variations of $V_x \pm$ variations in the base-to-emitter junction voltage of transistor 11.

Since this voltage is to be used to control the voltage at the base of a constant current source transistor, which in itself will have a base-to-emitter junction voltage variation with temperature, it is desired that the overall temperature compensation factor present in the $V_R$ equation has an overall value of minus one. Since there is effectively a minus one compensation factor attributable to the base-to-emitter junction of transistor 11, it is necessary to construct the temperature compensation circuit 19 such that its overall contribution to the temperature compensation factor is zero, i.e.

$$\frac{\delta V_x}{\delta T} = 0,$$

if T is temperature.

Figure 2:
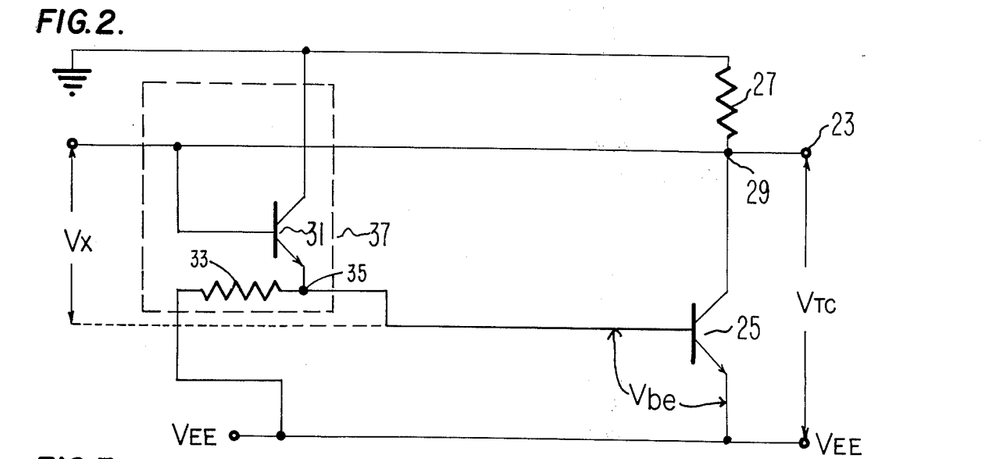
FIG. 2 is a schematic diagram of a temperature compensating subcircuit which has a temperature compensation factor of minus one and an overall temperature compensation factor of minus two.

Referring now to FIG. 2, a temperature compensation network having an overall temperature compensation factor of minus two will be described. The temperature compensation output 23 is taken from the collector of an output transistor 25 whose emitter is coupled to a source of potential $V_{EE}$. A resistor 27 is connected between ground and the junction 29 of the collector of transistor 25 and the temperature compensation output 23. Junction 29 is coupled to the base of a second compensating transistor 31 whose collector is connected to ground and whose emitter is coupled through resistor 33 to a source of potential $V_{EE}$. The junction 35 between the emitter of transistor 31 and resistor 33 is coupled to the base of output transistor 25. The voltage $V_{TC}$ which appears between the terminal 23 and the source of potential $V_{EE}$ has an overall temperature compensation factor of minus two, as readily seen from the circuit. One $V_{be}$ is derived from subcircuit 37, as represented by $V_x$ which is measured between the base of transistor 31 and junction 35, and the second portion of the overall factor of $V_{TC}$ is accounted for by the $V_{be}$ drop of output transistor 25.

Figure 3:
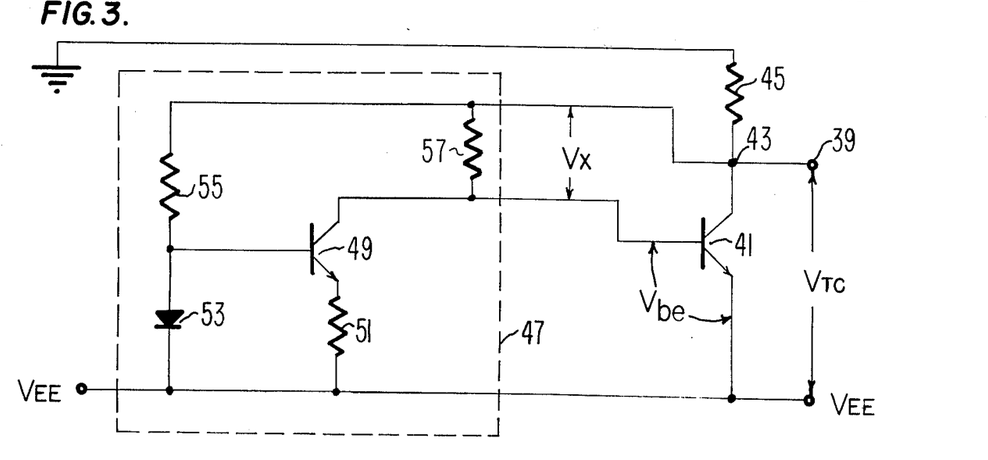
FIG. 3 is a schematic diagram of a temperature compensation subcircuit having a temperature compensation factor of plus one and an overall compensation factor of zero.

Referring now to FIG. 3, a temperature compensation network having an overall temperature compensation factor of zero and a subcircuit temperature compensation factor of plus one for $V_x$ will be described. A temperature compensation network output 39 is taken from the collector of an output compensation transistor 41 via junction 43. The emitter of transistor 41 is connected to a source of potential $V_{EE}$ and junction 43 is connected to ground through a resistor 45. A temperature compensating subcircuit 47 includes a transistor 49 whose emitter is coupled to a source of potential $V_{EE}$ through resistor 51 and whose collector is coupled to the base of output transistor 41. The base of transistor 49 is coupled to the source of potential $V_{EE}$ via diode 53 whose anode is connected to the base of transistor 49 and whose cathode is connected to the source of potential $V_{EE}$. As known in the art, this diode may be an integrated circuit transistor which has its collector connected directly to its base or the like. The junction of the anode of diode 53 with the base of transistor 49 is connected to junction 43 via resistor 55. A resistor 57 is then coupled between junction 43 and the base of transistor 41. The voltage $V_x$ which appears across resistor 57 exhibits a temperature compensation factor of plus one for the subcircuit 47. Since this plus one factor exists between the junction 43 and the base of transistor 41, the $V_{be}$ voltage drop of transistor 41 supplies a factor of minus one giving an overall temperature compensation factor of zero for the voltage $V_{TC}$ appearing between the terminal 39 and the source of potential $V_{EE}$.

Figure 4:
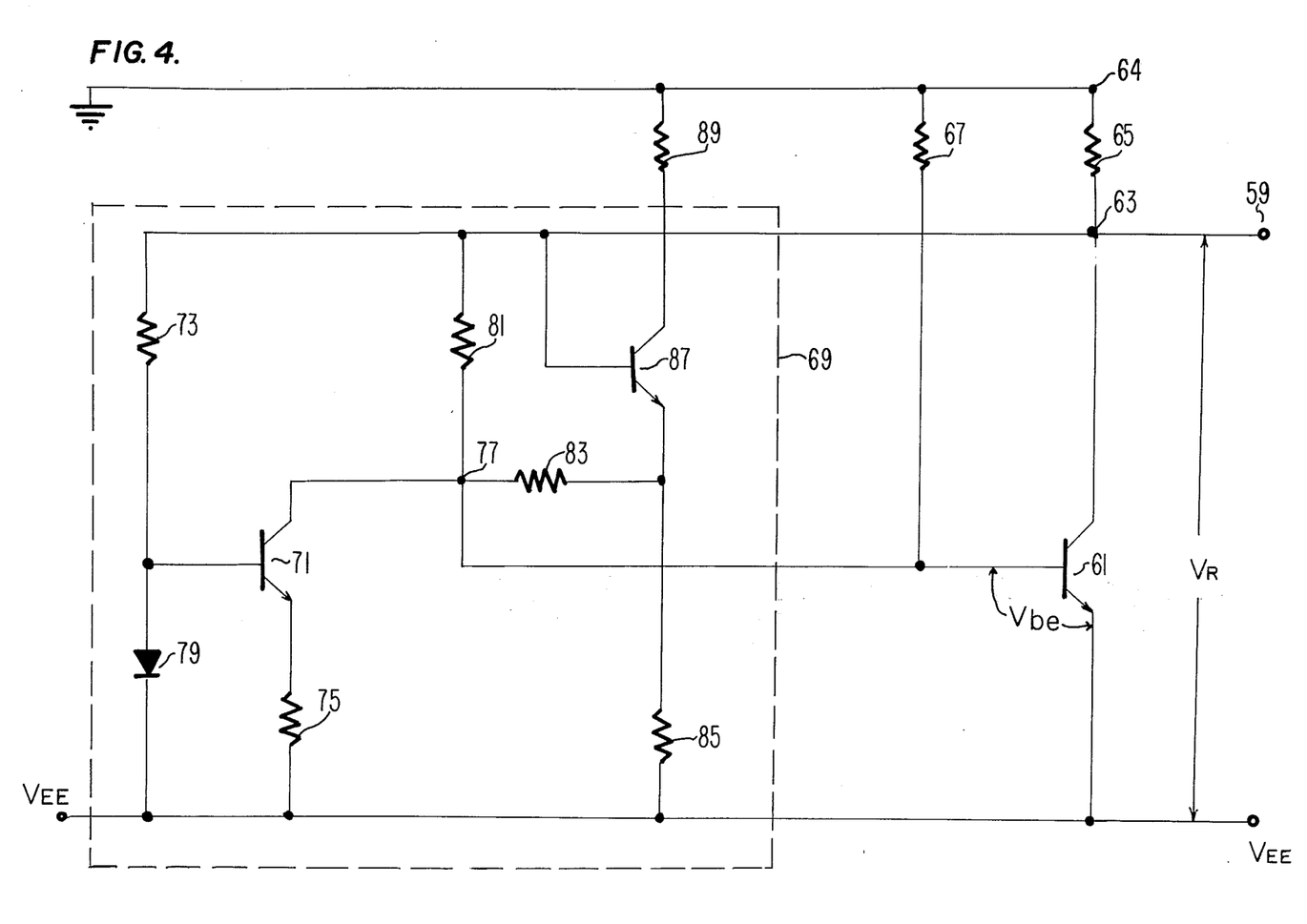
FIG. 4 is a schematic diagram of the entire voltage and temperature compensation circuit of the present invention.

FIG. 4 shows the voltage and temperature compensation network of the present invention which exhibits an overall temperature compensation factor of minus one at the output and is comprised of the combination of the subcircuits of FIGS. 2 and 3 via a unique voltage divider configuration. An output 59 of the voltage and temperature compensation network is taken from the collector of an output transistor 61 whose emitter is coupled to a source of potential $V_{EE}$. The junction 63 of output terminal 59 and the collector of transistor 61 is coupled to ground node 64 through resistor 65. A voltage compensation resistor 67 is coupled between ground and the base of output transistor 61 so as to allow for a one-to-one tracking (with respect to ground) of variations in power supply voltage, thereby insuring that the regulated voltage $V_R$, which is measured with respect to the power supply voltage, remains invariant with fluctuations in supply voltage $V_{EE}$.

A temperature compensating subcircuit 69 will now be described. A first temperature compensation transistor 71 has its base coupled to node 63 via resistor 73, its emitter coupled to a source of potential $V_{EE}$ through a resistor 75, and its collector coupled to the base of transistor 61 via node 77. The junction of resistor 73 and the base of transistor 71 is coupled to the source of potential $V_{EE}$ through a diode 79 whose anode is poled toward the base of transistor 71 and whose cathode is poled toward the source of potential $V_{EE}$. A voltage divider comprising three resistors 81, 83 and 85 is coupled between junction 63 and the source of potential $V_{EE}$. The first voltage divider resistor 81 has one end coupled to junction 63 and the opposite end connected to node 77. Node 77 is connected via resistor 83 to the emitter of a second compensating transistor 87 and the junction of the emitter of transistor 87 with resistor 83 is coupled to a source of potential $V_{EE}$ via resistor 85. Temperature compensation transistor 87 has its base coupled to junction 63 and its collector is coupled through a resistor 89 to ground. The junction 77 is also coupled to the base of output transistor 61 so as to control the compensated output voltage as seen at terminal 59 and provide an overall compensated voltage $V_R$ which will remain invariant with fluctuations in the power supply $V_{EE}$ and provide an overall temperature compensation factor of minus one.

Briefly, the operation of the circuit of FIG. 4 with respect to compensation for fluctuations in supply voltage will be described. Recall that the output voltage $V_R$ must remain invariant with fluctuations in supply voltage $V_{EE}$. Since $V_R$ is measured with respect to $V_{EE}$, the voltage at junction 63, when measured with respect to ground, must track the variations in $V_{EE}$ on a one-to-one basis so as to maintain the voltage $V_R$ invariant. If the supply voltage $V_{EE}$ were to become more negative or, what amounts to the same thing, if the ground node 64 were to become more positive, the potential $V_R$ would tend to vary. As $V_{EE}$ becomes more negative, the magnitude of $V_R$ would tend to become greater since the node 63 is tied to ground through resistor 65 and would remain relatively constant while $V_{EE}$ increased thereby necessitating an increase in $V_R$. Similarly, as node 64 goes more positive, junction 63 would tend to follow node 64 since it is tied to node 64 through resistor 65, and since node 63 tends to go positive with respect to the supply voltage $V_{EE}$, the voltage $V_R$ increases in magnitude just as in the case wherein $V_{EE}$ increased and the node voltage 63 remained constant.

But the circuit of the present invention is designed such that $V_R$ remains invariant with fluctuations in supply voltage or ground level. An attempted increase of $V_R$ is feed back through box 69 to the base of transistor 61, thereby increasing the collector current of transistor 61 and, subsequently, keeping $V_R$ relatively constant. This feed-back control, however, is not perfect, because an enlarged collector current requires a slightly increased $V_{be}$ and, hence, a slightly increased $V_R$ which is equal to the sum of $V_x$ and $V_{be}$. This remaining error is compensated for by a supplementary base current $I_b$ which is provided through resistor 67 which connects the base of transistor 61 to ground. As $V_{EE}$ goes more negative, the relatively constant base-to-emitter voltage of transistor 61 requires that the voltage at the base of the transistor 61 goes more negative as well. Since the voltage at the base of transistor 61 goes more negative and since the other end of resistor 67 is tied to ground, the supplementary base current $I_b$ must increase to account for the drop in voltage across the resistor 67. The increase in the base circuit is amplified by the current gain $\beta$ (beta) such that the collector current through resistor 65 increases by a factor of $\beta$ times the increase in base current. The increase in collector current through the transistor 61 and hence through resistor 65 insures that a greater voltage drop occurs across the resistor 65 with the result that junction 63 goes more negative. The values of the resistor 65 and 67 when taken in conjunction with the current gain factor of transistor 61 allow a selection of parameters such that variation in supply voltage with respect to ground are compensated for by induced variations in the voltage level of junction 63 which track variations in supply voltage $V_{EE}$ on a one-to-one basis so as to maintain the voltage difference $V_R$ between the junction 63 and the supply voltage $V_{EE}$ absolutely invariant.

To avoid confusion, the same operation will be briefly described for values referenced to the supply voltage $V_{EE}$ instead of ground. As indicated above, $V_{EE}$ going more negative with respect to ground is the equivalent of node 64 going more positive with respect to the supply voltage. If node 64 goes more positive, it will tend to pull the junction 63 along with it, hence, tending to increase the value of $V_R$. Since it is an object of the present invention to maintain $V_R$ invariant with fluctuations in supply voltage or ground level, junction 63 must be driven more negative by dropping a greater voltage across resistor 65. Again, the presence of resistor 67 between the node 64 and the base of transistor 61 provides the necessary compensation for the imperfection of the basic feed-back control loop constituted by transistor 61 and box 69. As the voltage at node 64 increases and the voltage at the base of transistor 61 remains relatively constant since it is tied through the base emitter junction to the supply or reference potential $V_{EE}$, a greater voltage is dropped across resistor 67. This greater voltage drop across resistor 67 results in an increase in base current $I_b$. An increased base current drives the transistor harder and results in an increased collector current which is related to the increase in base current by the current gain factor of transistor 61. The increased collector current causes a greater voltage drop across resistor 65 thereby forcing the potential of junction 63, lower as desired. Values of current gain and resistors can be chosen such that junction 63 would tend to be driven lower such that the voltage $V_R$ remains invariant. In either description, it is evident that the use of resistor 67 insures that $V_R$ remains invariant with fluctuations in supply voltage or ground plane level while the variations appear across the resistor 65 instead.

A similar operation would result should the supply voltage $V_{EE}$ go more positive with respect to ground or the node 64 tend to go more negative with respect to $V_{EE}$. In either event, the operation of the circuit is substantially as described above but with decreased collector current and less voltage dropped across resistor 65.

Figure 5:
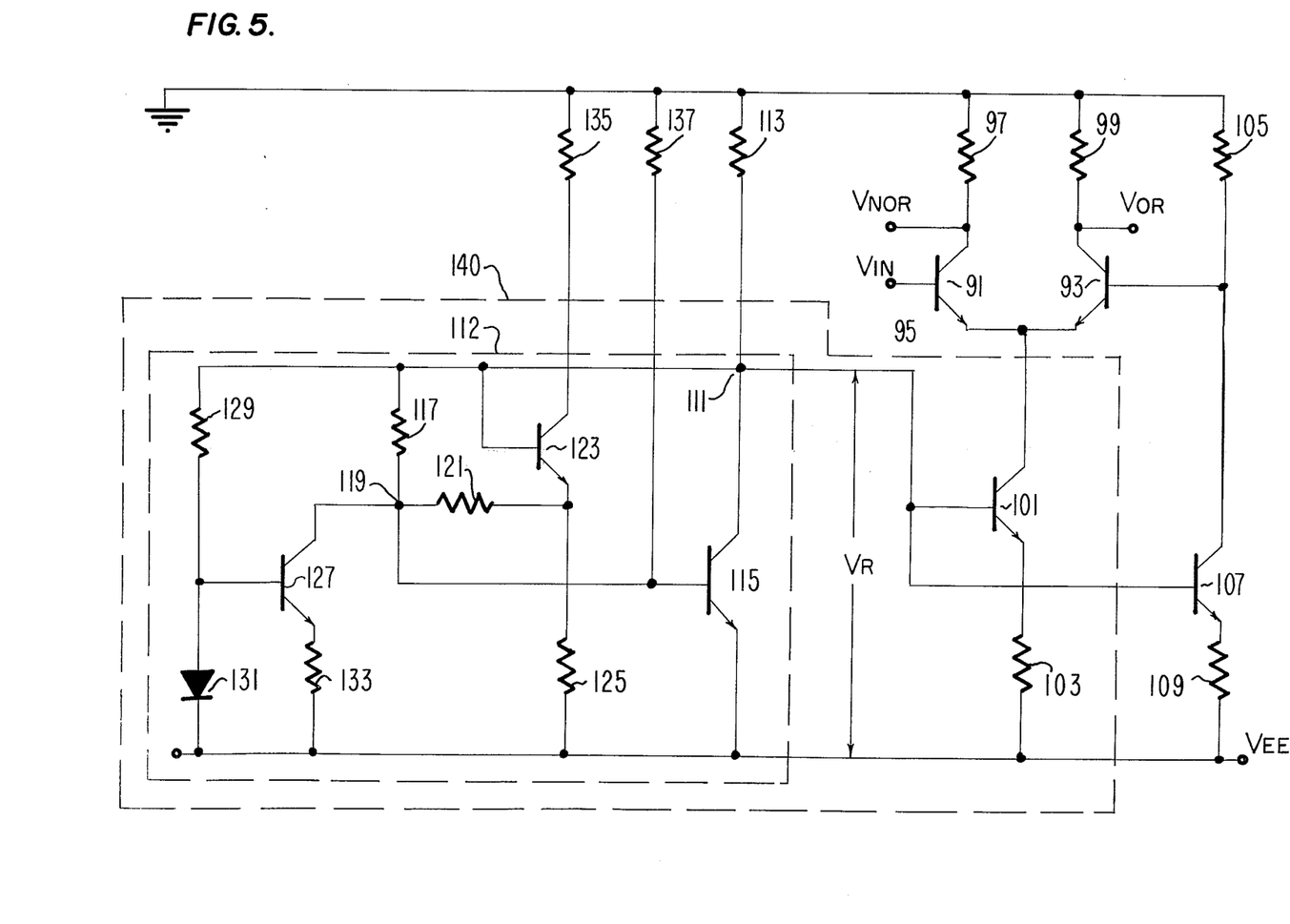
FIG. 5 is a schematic diagram of an improved CML logic circuit which includes the overall voltage and temperature compensating circuit of FIG. 4.

Referring now to FIG. 5, a fully-compensated CML logic gate which includes the voltage and temperature compensated constant current source subcombination of the present invention which in turn utilizes the preferred embodiment of the voltage and temperature compensation circuit of FIG. 4, will be described.

A differential amplifier stage of the CML gate includes an input transistor 91 and a non-input transistor 93. The input to the logic gate would be fed via terminal 95 to the base of the input transistor 91. The outputs of the logic gate are taken from the collectors of transistors 91 and 93 respectively. The collector of transistor 91 is also connected to ground through a resistor 97 and the collector of transistor 93 is connected to ground through resistor 99. The emitters of transistors 91 and 93 are coupled together at junction 100 and connected to the collector of a constant current source transistor 101 whose emitter is connected via emitter resistor 103 to a source of potential $V_{EE}$. The base of non-inverting transistor 93 is coupled to ground through resistor 105 and to the collector of a second constant current source transistor 107 whose emitter is coupled to the source of potential $V_{EE}$ via emitter resistor 109. The bases of the constant current transistors 101 and 107 are coupled together at node 111 which corresponds to the output 59 and correspondingly junction 63 of the temperature and voltage compensating network of the circuit of FIG. 4 which is indicated by the dotted block 112 in the circuit of FIG. 5. Junction 111 is coupled to ground through resistor 113 and to the collector of a temperature compensation output transistor 115 whose emitter is coupled to the source of potential $V_{EE}$. The three-resistor voltage divider is coupled between junction 111 and the source of potential $V_{EE}$ such that one end of resistor 117 is coupled to the junction 111 and the other end of resistor 117 is coupled to node 119 and then through resistor 121 to the emitter of a temperature compensation transistor 123 and thence to the source of potential $V_{EE}$ via resistor 125. Node 111 is also coupled to the base of the second temperature compensating transistor 127 through a resistor 129. The base of transistor 127 is further coupled through a diode 131 to the source of potential $V_{EE}$ such that the diode is poled with its anode toward the base of transistor 127 and its cathode is poled toward the source of potential $V_{EE}$. Transistor 127 has its emitter coupled through resistor 133 to the source of potential $V_{EE}$ and its collector coupled to node 119. Transistor 123 has its base connected to the node 111 and its collector coupled to ground either directly or through resistor 135. The base of transistor 115 is coupled to ground via a voltage compensation resistor 137 in order that the output of transistor 115 can track fluctuations in supply voltage on a one-to-one basis with respect to ground thereby holding $V_R$ invariant. The collector of transistor 115 is then connected to node 111 for temperature compensation purposes such that the output voltage $V_R$, as measured between junction 111 and the source of potential $V_{EE}$, is fully compensated for fluctuations in the voltage supply and for variations in junction temperature.

This compensated control voltage $V_R$ is supplied to the base of constant current source transistors 101 and 107 respectively and since this voltage remains invariant with fluctuations in the power supply voltage and compensates for voltage variations of up to that of one $V_{be}$ which might result from junction temperature variations, the output of these constant current source transistors remains truly constant. A fully compensated truly constant current source is shown as the combination within the dotted lines defining block 140 of the circuit of FIG. 5. The constant current which is supplied to the coupled emitters of transistors 91 and 93 via the combination of constant current source transistor 101 and its emitter resistor 103 and the constant current which flows from the constant current source comprising transistor 107 and its emitter resistor 109 which is fed to the base of the non-input transistor 93 and through resistor 105 to ground insures that the input thresholds and the output voltage levels are truly constant and will not vary with fluctuations in power supply voltage nor with variations in junction temperature. The improved regulated CML logic gate and its compensation network for providing a regulated voltage compensated for fluctuations in power supply and for variations in junction temperature insures that the constant current source stages of the CML logic gate supply truly constant currents hence insuring input thresholds and output voltage levels which are invariant with changes in supply voltage or variations in junction temperatures.

The following list of resistor values for the circuit of FIG. 4 is provided with the understanding that the values given are considered to denote a specific preferred embodiment already built and tested, it being understood that those skilled in the art could certainly practice the present invention with other component values and still achieve the objects of this invention.

All values refer to the resistors of FIG. 4 and are given in ohms but the values apply to corresponding resistors in the other circuits as well.

R65 = 51
R67 = 3000
R73 = 307
R75 = 78
R81 = 330
R83 = 594
R85 = 179
R89 = Very small or zero With this detailed description of the structure and operation of the present invention it will be obvious to those skilled in the art that various modifications can be made without departing from the spirit and scope of the invention which is limited only by the appended claims.

What is claimed is:

1. An improved current mode logic (CML) circuit having input thresholds and output levels which are substantially invariant with fluctuations in junction temperature and supply voltage, said logic circuit comprising:
   first and second transistors having commonly coupled emitters, the base of said first transistor serving as an input means;
   means for generating a control signal which tracks variations in supply voltage on a one-to-one basis and compensates for junction temperature variations of as much as one $V_{be}$; and means responsive to said control signal and compensated thereby for supplying a constant current to said commonly coupled emitters.

2. The improved CML logic circuit of claim 1 wherein said responsive means for supplying a constant current includes a third transistor having a base electrode, a collector and an emitter and an emitter resistor, said third transistor and said emitter resistor being serially coupled between said commonly coupled emitters of said first and second transistors and a source of potential, the base electrode of said third transistor serving to receive said control signal to compensate said third transistor for junction temperature variations of as much as one $V_{be}$ and for variations in supply voltage on a one-to-one basis for insuring said supply of constant current through the collector of said third transistor.

3. The improved CML logic circuit of claim 2 further including a second means responsive to said control signal for supplying a constant current to the base of said second transistor, said second responsive means including a fourth transistor and a second emitter resistor serially coupled between the base of said second transistor and said source of potential, the collector of said fourth transistor being coupled to the base of said second transistor and the emitter of said fourth transistor being coupled through said second emitter resistor to said source of potential.

4. The CML logic circuit of claim 3 wherein said second responsive means for supplying a constant current to the base of said second transistor further includes resistive means coupled between the junction of the collector of said fourth transistor with the base of said second transistor and ground.

5. The improved CML logic circuit of claim 1 wherein said means for generating a control signal comprises:
control signal output means including an output transistor and a resistive means serially coupled between said source of potential and ground, said resistive means being coupled between ground and the collector of said output transistor and said control signal output being taken from the junction of said resistive means with the collector of said output transistor;
resistive tracking means coupled to the base of said output transistor for controlling the conduction of said output transistor and insuring that said control signal output tracks variations in supply voltage on a one-to-one basis; and
temperature compensation means coupled to said control signal output and to the base of said output transistor for allowing said output signal to compensate for junction temperature variations of as much as one $V_{be}$.

6. The CML logic circuit of claim 5 wherein said temperature compensation means includes:
a first temperature compensation transistor having its base resistively coupled to said control signal output, its emitter resistively coupled to said source of potential, and its collector coupled to the base of said output transistor;
a second temperature compensation transistor having its collector resistively coupled to ground, its emitter resistively coupled to said source of potential, and its base coupled to said control signal output; and voltage divider means serially coupled between said control signal output and said source of potential, said voltage divider means including first, second and third voltage dividing resistors, said first voltage dividing resistor having one end coupled to said control signal output and the other end coupled to the junction of the collector of said first temperature compensation transistor with the base of said output transistor and one end of said second voltage dividing resistor, said second voltage dividing resistor having its other end coupled to the junction of the emitter of said second temperature compensation transistor with one end of said third voltage dividing resistor, the other end of said third voltage dividing resistor being connected to said source of potential.

7. The CML logic circuit of claim 6 wherein said temperature compensation means further includes diode means coupled between the base of said first temperature compensation transistor and said source of potential.

8. In a CML logic gate having first and second transistors each of which includes a collector electrode, a base electrode, and an emitter electrode, the emitter electrode of said first transistor being commonly coupled to the emitter electrode of said second transistor, the base of said first transistor serving as an input means and a collector of at least one of said transistors serving as a circuit output, the improvement comprising:
biasing means for coupling a power supply to said commonly coupled emitters of said first and second transistors; and
compensation means for controllably varying said biasing means to compensate for variations in supply voltage and junction temperature; and wherein said biasing means includes a first biasing transistor and a first emitter resistor serially coupled between the commonly coupled emitters of said first and second transistors and said source of potential, the collector of said first biasing transistor being coupled to said commonly coupled emitters and the emitter of said first biasing transistor being coupled to said source of potential through said first emitter resistor, and a second biasing transistor and a second emitter resistor serially coupled between the base of said commonly coupled second transistor and said source of potential, the collector of said second biasing transistor being coupled to the base of said second commonly coupled transistor and the emitter of said second biasing transistor being coupled to said source of potential through said second emitter resistor and wherein said biasing means further includes a biasing resistor coupled between the junction of the base of said second commonly coupled transistor with the collector of said second biasing transistor and ground.

9. In a CML logic gate having first and second transistors each of which includes a collector electrode, a base electrode, and an emitter electrode, the emitter electrode of said first transistor being commonly coupled to the emitter electrode of said second transistor, the base electrode of said first transistor serving as an input means to said logic gate and the collector electrode of at least one of said first and second transistors serving as a logic gate output means, the improvement comprising:

biasing means for coupling a power supply to said first and second transistors, said biasing means including a third transistor having its collector coupled to the commonly coupled emitters of said first and second transistors and its emitter coupled to said power supply for supplying current to said commonly coupled emitters, said third transistor further including a base electrode for receiving a control signal for varying the conductivity of said third transistor; and temperature compensation means coupled to the base electrode of said third transistor for controllably varying said biasing means to compensate for variations in the base to emitter voltage of said third transistor with temperature so as to insure a constant current output from the collector of said third transistor, said compensation means including a compensaton circuit output means for supplying a control signal to the base electrode of said third transistor for varying its conductivity and a temperature compensation subcircuit means connected to said compensation circuit output means for compensating said control signal for variations in the base-to-emitter junction voltage of said third transistor with temperature to insure said constant current output.

10. The improved CML logic gate of claim 9 wherein said compensation circuit output means includes an output transistor having its emitter coupled to said source of potential and its collector resistively coupled to ground, said control signal being taken from the collector of said output transistor; wherein said resistive means includes a resistor coupled between ground and the base of said output transistor; and wherein said temperature compensation means includes:

a first temperature compensation transistor having its base resistively coupled to said compensation circuit output, its emitter resistively coupled to said source of potential, and its collector coupled to the base of said output transistor;

a second temperature compensation transistor having its collector resistively coupled to ground and its base coupled to said compensation circuit output; and voltage divider means coupled between said compensation circuit output and said source of potential for controlling the temperature compensation factor of said temperature compensation means.

11. The improved CML logic gate of claim 10 wherein said voltage divider means includes first, second and third voltage divider resistors, one end of said first voltage divider resistor being coupled to said compensation circuit output and the other end being coupled to the junction of the collector of said first temperature compensation transistor with the base of said output transistor and one end of said second voltage divider resistor the other end of said second voltage divider resistor being coupled to the junction of the emitter of said second temperature compensation transistor with one end of said third voltage divider resistor, and the other end of said third voltage divider resistor being coupled to said source of potential.

12. The CML logic gate of claim 11 wherein said temperature compensation means further includes diode means coupled between the base of said first temperature compensation transistor and said source of potential, said diode means being poled with its anode toward the base of said first temperature compensation transistor and its cathode towards said source of potential.

13. An integratable temperature compensation circuit for providing an output signal which is compensated for variations in junction temperature of as much as one base-to-emitter voltage drop, said temperature compensation circuit comprising:

output means including an output transistor and a resistive means serially coupled between a source of potential and ground, the collector of said output transistor being coupled to said resistive means and the emitter of said output transistor being coupled to said source of potential, said output means further including an output taken from the junction of the collector of said output transistor with said resistive means;

a first temperature compensating transistor having its collector coupled to the base of said output transistor, its base resistively coupled to said output, and its emitter resistively coupled to said source of potential;

a second temperature compensating transistor having its collector resistively coupled to ground and its base coupled to said output;

a three-resistor serial voltage divider coupled between said output and said source of potential, a first tap of said voltage divider being coupled to the junction of the collector of said first temperature compensating transistor and the base of said output transistor and a second tap of said voltage divider being coupled to the emitter of said second temperature compensating transistor; and diode means coupled between the base of said first temperature compensating transistor and said source of potential.

14. An integratable compensation circuit for generating an output signal which tracks variations in supply voltage or ground level on a one-to-one basis and is permitted to vary by one $V_{be}$ with variations in junction temperature, said compensation circuit comprising:

output means including an output transistor and a circuit output associated with the collector of said output transistor;

resistive means coupled to the base of said output transistor for controlling the voltage level of said circuit output with respect to ground so as to track fluctuations in supply voltage on a one-to-one basis thereby maintaining the voltage level of the circuit output invariant with respect to the supply voltage; and temperature compensation means coupled to said output means for allowing the voltage level at said circuit output to vary so as to compensate for variations of as much as one $V_{be}$ with variations in junction temperature.

15. The compensation circuit of claim 14 wherein said temperature compensation means includes:

a first temperature compensating subcircuit having a temperature compensation factor of minus one;

a second temperature compensating subcircuit having a temperature compensation factor of plus one; and voltage divider means coupling said first temperature compensating subcircuit, said second temperature compensating subcircuit, and said output means for providing an output signal having an overall temperature compensation factor of minus one.

16. The logic circuit of claim 15:

wherein said first temperature compensating subcircuit includes:

a first temperature compensating transistor, a first emitter resistor, and a first temperature compensating transistor having its base coupled to said circuit output through said first temperature compensating subcircuit resistor, its collector coupled to the base of said output transistor, and its emitter coupled to said source of supply voltage through said first emitter resistor, said first temperature compensating subcircuit further including diode means coupled between the base of said first temperature compensating transistor and said source of supply voltage;

wherein said second temperature compensating subcircuit includes:

a second temperature compensating transistor and a second temperature compensating subcircuit resistor, said second temperature compensating transistor having its collector coupled to ground through said second temperature compensating subcircuit resistor and its base coupled to said circuit output; and wherein said voltage divider means includes first, second and third serially coupled voltage divider resistors with first and second voltage divider taps therebetween, said first voltage divider resistor having one end connected to said circuit output and the other end coupled to said second voltage divider resistor at said first voltage divider tap, said first voltage divider tap being coupled to the collector of said first temperature compensating transistor and to the base of said output transistor, the other end of said second voltage divider resistor being coupled to said third voltage divider resistor at said second voltage divider tap, said second voltage divider tap being coupled to the emitter of said second temperature compensating transistor, and the other end of said third voltage divider resistor being coupled to said source of supply voltage.

17. A temperature and voltage compensated constant current source comprising:

a constant current source transistor and an emitter resistor, said emitter resistor being coupled between the emitter of said constant current source transistor and a source of potential and the collector of said constant current source transistor serving as a constant current source output;

compensation output means for supplying a voltage and temperature compensated control signal to the base of said constant current source transistor for maintaining a truly constant current at said constant current source output;

voltage compensation means coupled to said compensation output means for tracking fluctuations in said source of potential on a one-to-one basis with respect to ground so as to maintain the control signal invariant with respect to said source of potential; and temperature compensation means coupled to said compensation output means for adjusting the level of said control signal for compensating for voltage variations of as much as one $V_{be}$ with variations in junction temperature.

18. The compensated constant current source of claim 17 wherein said temperature compensation means includes:

a first temperature compensation subcircuit having a overall temperature compensation factor of minus one $V_{be}$;

a second temperature compensation subcircuit having an overall temperature compensation factor of plus one $V_{be}$;

voltage divider means for coupling said first and second temperature compensation subcircuits so as to provide an overall combined temperature compensation factor of zero; and means for coupling said overall combined temperature compensation factor of zero to said compensation output means such that the overall temperature compensation factor of said compensated control signal is minus one $V_{be}$.

19. The compensated constant current source of claim 17, wherein said compensation output means includes a compensation output transistor and a resistor, said resistor being coupled between ground and the collector of said compensation output transistor, the the emitter of said compensation output transistor being coupled to said source of potential, and an output for said compensating control signal, said output being located at the junction of said resistor and the collector of said compenstion output transistor.

20. The compensated constant current source of claim 19 wherein said voltage compensation means includes a resistor coupled between said ground and the base of said compensation output transistor for enabling the output to track fluctuations in source potential on a one-to-one basis with respect to ground thereby maintaining said compensated control signal invariant with respect to variations in said source of potential.

21. The compensated constant current source of claim 20 wherein said temperature compensation means includes:

a first temperature compensation subcircuit having a negative temperature compensation factor;

a second temperature compensation subcircuit having a positive temperature compensation factor;

means for coupling said first and second temperature compensation subcircuits between said compensation control signal output and the base of said compensation output transistor so as to cancel out the effects of said positive and negative temperature compensation factors of said temperature compensation subcircuits such that said compensation control signal is compensated for variations of as much as one $V_{be}$ by the base to emitter junction of said compensation output transistor.

22. The compensated constant current source of claim 21 wherein:

said first temperature compensation subcircuit includes a first temperature compensation transistor having its base resistively coupled to said compensated control signal output, its emitter resistively coupled to said source of potential and its collector coupled to the base of said compensation output transistor; said first temperature compensation subcircuit further including a first temperature compensation resistor coupled between said compensated control signal output and the junction of the collector of said first temperature compensation transistor and the base of said compensation output transistor;

said second temperature compensation subcircuit includes a second temperature compensation transistor having its base coupled to said compensated control signal output and its collector coupled to ground, said second temperature compensation subcircuit further including a second temperature compensation resistor coupling the emitter of said second temperature compensation transistor to said source of potential; and said coupling means includes a third temperature compensation resistor coupling the junction of said first temperature compensation resistor and the collector of said first temperature compensation resistor and the collector of said first temperature compensation transistor and the base of said compensation output transistor with the junction of said second temperature compensation resistor and the emitter of said second temperature compensation transistor, said first third and second temperature compensation resistors forming a voltage divider and the voltage appearing across said first temperature compensation resistor being coupled between the base of said compensation output transistor and said compensated control signal output and having overall temperature compensation factor of zero.

23. A temperature compensated constant current source comprising:

a constant current source transistor and an emitter resistor, said emitter resistor being coupled between the emitter of said constant current source transistor and a source of potential and the collector of said constant current source transistor serving as a constant current source output;

compensation output means for supplying a temperature compensated control signal to the base of said constant current source transistor for maintaining a truly constant temperature-independent current at said constant current source output; and temperature compensation means coupled to said compensation output means for adjusting the level of said control signal for compensating for voltage variations of as much as one $V_{be}$ with variations in junction temperature, said temperature compensation means includes:

a first temperature compensation sub-circuit having an overall temperature compensation factor of minus one $V_{be}$;

a second temperature compensation sub-circuit having an overall temperature compensation factor of plus one $V_{be}$;

voltage divider means for coupling said first and second temperature compensation sub-circuits so as to provide an overall combined temperature compensation factor of zero; and means for coupling said voltage divider means for providing said overall combined temperature compensation factor of zero to said compensation output means such that the overall temperature compensation factor of said compensated control signal is minus one $V_{be}$.

* * * * *